United States Patent [19]
You et al.

[11] Patent Number: 6,077,746
[45] Date of Patent: Jun. 20, 2000

[54] USING P-TYPE HALO IMPLANT AS ROM CELL ISOLATION IN FLAT-CELL MASK ROM PROCESS

[75] Inventors: Jyh-Cheng You, I-Lan; Lin-June Wu, Hsin-Chu, both of Taiwan

[73] Assignee: Taiwan Semiconductor Manufacturing Company, Hsin-Chu, Taiwan

[21] Appl. No.: 09/383,599

[22] Filed: Aug. 26, 1999

[51] Int. Cl.[7] .............................................. H01L 21/8236
[52] U.S. Cl. ...................... 438/276; 438/306; 438/373; 438/377; 438/546
[58] Field of Search ..................... 257/390, 344, 257/402, 408; 438/130, 128, 213, 214, 217, 231, 232, 241, 255, 275, 276, 302, 303, 305, 306, 372, 373, 377, 546, 587, 592, 787

[56] References Cited

U.S. PATENT DOCUMENTS

| | | | |
|---|---|---|---|
| 3,764,396 | 10/1973 | Tarui et al. | 438/377 |
| 4,649,629 | 3/1987 | Miller et al. | 438/130 |
| 5,272,367 | 12/1993 | Dennison et al. | 257/306 |
| 5,345,104 | 9/1994 | Prall et al. | 257/607 |
| 5,716,862 | 2/1998 | Ahmad et al. | 438/303 |
| 5,837,590 | 11/1998 | Latham et al. | 438/364 |
| 5,843,815 | 12/1998 | Liaw | 438/238 |
| 5,846,865 | 12/1998 | Sheng et al. | 438/276 |
| 5,849,615 | 12/1998 | Ahmad et al. | 438/231 |
| 5,891,777 | 4/1999 | Chang | 438/275 |

*Primary Examiner*—Donald L. Monin, Jr.
*Assistant Examiner*—Hoai Pham
*Attorney, Agent, or Firm*—George O. Saile; Stephen B. Ackerman; Rosemary L. S. Pike

[57] ABSTRACT

A method for forming a p-type halo implant as ROM cell isolation in a flat-cell mask ROM process is described. A P-well is formed within a semiconductor substrate and an oxide layer is formed overlying a surface of the substrate. A photomask is formed overlying the oxide layer wherein openings are left within the photomask exposing portions of the oxide layer. First, ions are implanted through the exposed portions of the oxide layer into the underlying semiconductor substrate whereby buried bit lines are formed. Thereafter, second ions are implanted through the exposed portions of the oxide layer whereby halo regions are formed encompassing the buried bit lines. The halo regions provide ROM isolation and punch-through protection for the buried bit lines. Thereafter, the photomask is removed and fabrication of flat-cell mask ROM device is completed.

8 Claims, 2 Drawing Sheets

USING P-TYPE HALO IMPLANT AS ROM CELL ISOLATION IN FLAT-CELL MASK ROM PROCESS

BACKGROUND OF THE INVENTION (1) Field of the Invention

The invention relates to the fabrication of integrated circuit devices, and more particularly, to a method of both forming ROM cell isolation in the fabrication of integrated circuits.

(2) Description of the Prior Art

A read-only memory (ROM) is a nonvolatile memory in which information is permanently stored through the use of custom masks during fabrication. Mask ROM's with buried bit lines (flat cell) are the most popular types of read-only memory. Conventionally, the buried bit lines are formed by doping impurities into the substrate through a bit line mask. When the wafer is subjected to high temperature conditions in subsequent processing steps, the doping impurities within the buried bit lines will diffuse outward and toward one another causing punch-through to take place between adjacent bit lines. Therefore, the conventional process includes a cell punch through (CPT) implantation through a CPT mask to isolate the buried bit lines and prevent outdiffusion of impurities from the buried bit lines.

U.S. Pat. No. 5,846,865 to Sheng et al teaches a method of forming a flat-cell mask ROM device using bit lines formed by tungsten-filled trenches in order to prevent punch-through. U.S. Pat. No. 5,842,815 to Liaw discloses a self-aligned contact halo implant for an SRAM. U.S. Pat. No. 5,849,615 to Ahmad et al uses a blanket implant to form both LDD and halo regions at the same time for a DRAM. U.S. Pat. No. 5,716,862 to Ahmad et al discloses an N-type halo angled implant to prevent punch through. U.S. Pat. No. 4,649,629 to Miller et al shows a boron-doped halo implant for a ROM.

SUMMARY OF THE INVENTION

A principal object of the present invention is to provide an effective and very manufacturable method of forming a cell punch through implant as ROM cell isolation.

A further object of the invention is to provide a method of forming a p-type halo implant as ROM cell isolation.

Yet another object is to provide a method of forming a p-type halo implant as ROM cell isolation in a flat-cell mask ROM process.

Yet another object is to provide a method of forming a p-type halo implant as ROM cell isolation in a flat-cell mask ROM process wherein the process is simplified and no additional mask is required.

In accordance with the objects of this invention a method for forming a p-type halo implant as ROM cell isolation in a flat-cell mask ROM process is achieved. A P-well is formed within a semiconductor substrate and an oxide layer is formed overlying a surface of the semiconductor substrate. A photomask is formed overlying the oxide layer wherein openings are left within the photomask exposing portions of the oxide layer. First, ions are implanted through the exposed portions of the oxide layer into the underlying semiconductor substrate whereby buried bit lines are formed. Thereafter, second ions are implanted through the exposed portions of the oxide layer whereby halo regions are formed encompassing the buried bit lines. The halo regions provide ROM isolation and punch-through protection for the buried bit lines. Thereafter, the photomask is removed and fabrication of flat-cell mask ROM device is completed.

BRIEF DESCRIPTION OF THE DRAWINGS

In the accompanying drawings forming a material part of this description, there is shown.

DESCRIPTION OF THE PREFERRED EMBODIMENTS

Figure 1:
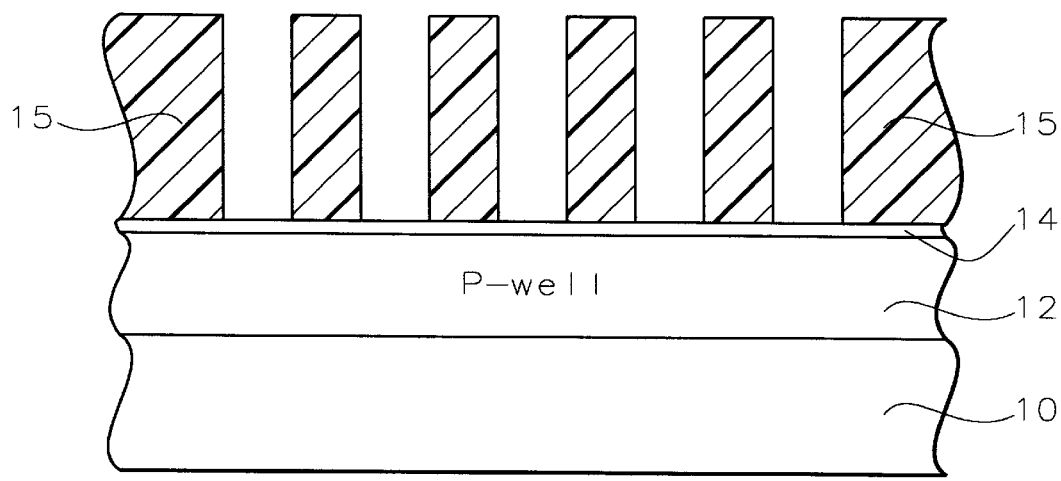
FIGS. 1 through 3 schematically illustrate in cross-sectional representation a preferred embodiment of the present invention.

The process of the present invention prevents punch through by a simplified process that saves a masking step and thus reduces production cost. Referring now more particularly to FIG. 1, there is shown an illustration of a flat cell mask ROM device. The semiconductor substrate 10 is preferably composed of silicon having a (100) crystallographic orientation. Usually, a ROM device is an NMOS device. PMOS would typically be used in a peripheral logic area of the integrated circuit device. The drawings illustrate the typical NMOS ROM device. A P-well 12 has been formed in the ROM portion of the device shown in the figures.

The surface of the silicon substrate 10 is thermally oxidized to form the desired pad oxide 14 thickness. The preferred thickness is between about 125 to 250 Angstroms.

A layer of photoresist is coated over the pad oxide layer 14 and patterned as is conventional in the art to form a photoresist mask 15 having openings where buried bit lines are to be formed within the substrate.

Figure 2:
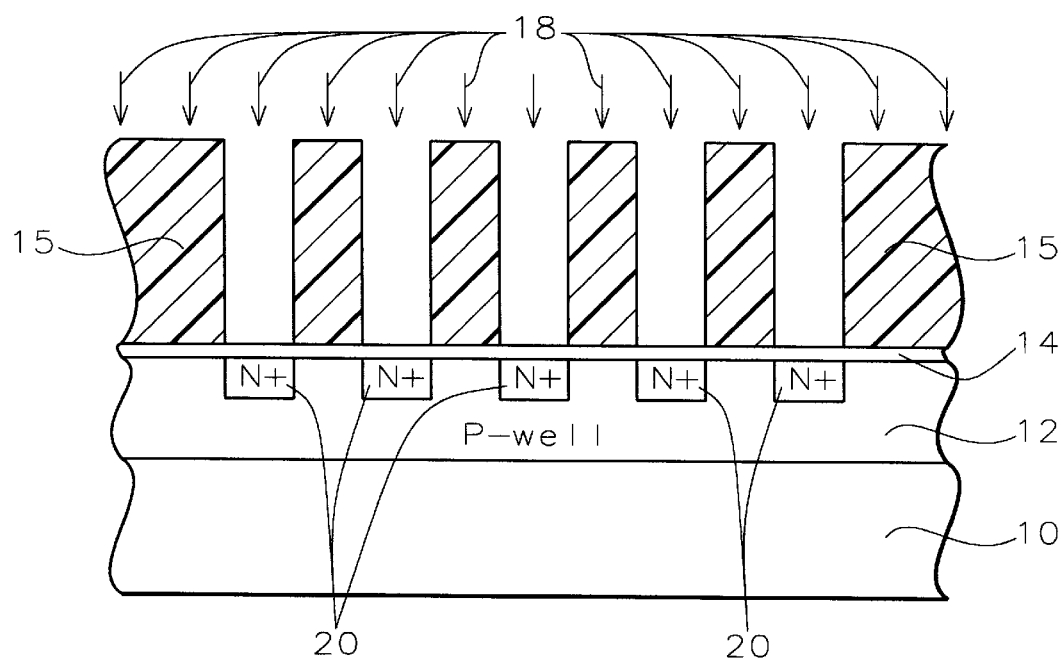

Referring now to FIG. 2, an ion implantation 18 is performed through the bit line mask 15. Typically, arsenic ions are implanted at a dosage of between about 1.5 E 15 and 3 E 15 atoms/cm$^2$ at an energy of between about 40 and 80 KeV to form buried bit lines 20 within the semiconductor substrate 10 not shielded by the photomask 15.

In the process of the prior art, the bit line photomask 15 would now be removed and a CPT photomask would be formed over the bit line region. However, the process of the present invention simplifies the process and reduces costs by eliminating the additional mask. The process of the invention uses a halo implant as a cell punch-through implantation through the existing bit line mask 15.

Figure 3:
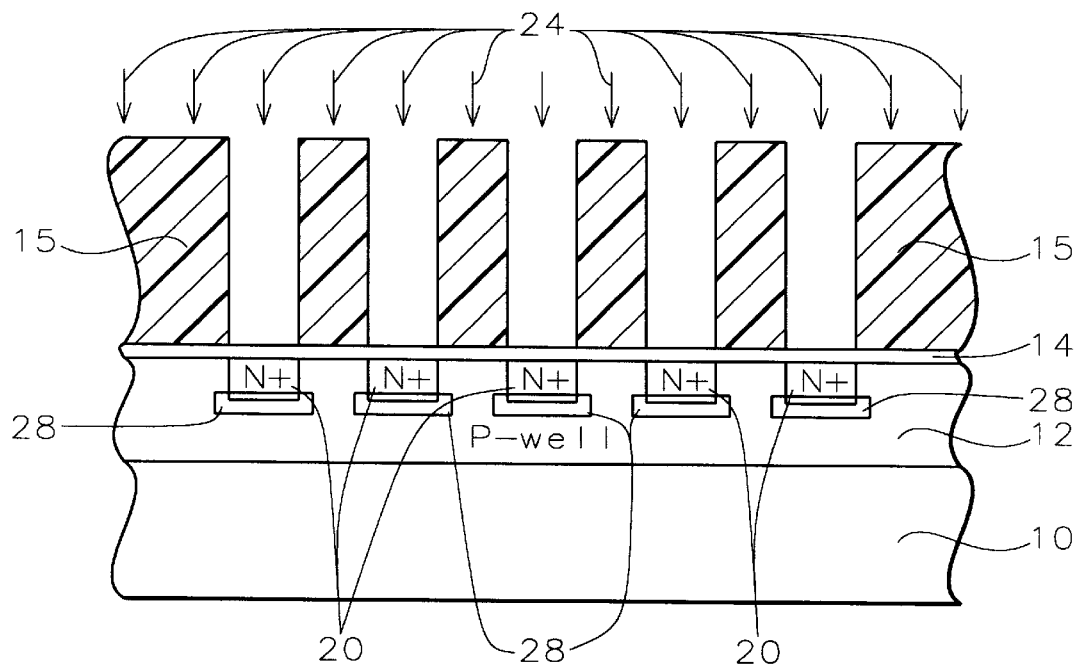

As shown in FIG. 3, the CPT halo implantation 24 is performed through the existing bit line photomask 15. Halo regions 28 are formed encompassing the buried bit lines and thus preventing punch-through.

A typical CPT ion implantation implants boron ions at an energy of 120 KeV and dosage of 1.0 E 13 atoms/cm$^2$. The halo implantation of the present invention implants boron ions with a dosage of between about 1.2 E 13 to 1.5 E 13 atoms/cm$^2$ at an energy of between about 100 to 140 KeV. The p-type halo implantation of the present invention has both higher energy and higher dosage than the implantation of the prior art. This results in a longer lateral diffusion area, as shown, which will encompass the buried bit lines. The implantation process of the invention works just as well as a CPT implant, but saves a masking step.

Figure 4:
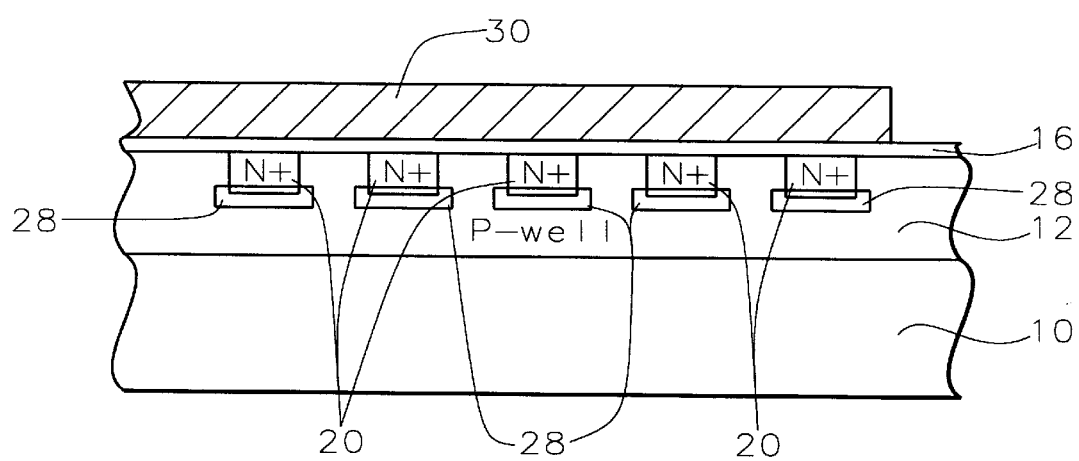
FIG. 4 schematically illustrates in cross-sectional representation a completed flat cell mask ROM device fabricated according to the process of the present invention.

Now the photomask 15 is removed and the flat-cell mask ROM device is completed as is conventional in the art. For example, as illustrated in FIG. 4, the pad oxide layer is removed and a gate oxide layer 16 is formed over the surface of the substrate. A polysilicon layer is deposited over the gate oxide layer and patterned to form the poly gate 30, as shown. A surface implant is performed to prevent surface leakage between bit line and bit line or between ROM device and ROM device. This completes the ROM process.

The process of the invention has been implemented. Yield and wafer acceptance test performance has been found to be comparable to the conventional CPT process. The p-type halo implantation can provide ROM cell isolation in the flat-cell mask ROM process while saving a masking step and thus reducing production costs.

The process of the invention provides a method of forming ROM isolation using a halo cell punch through implantation through the buried bit line mask, thus saving a masking step and, consequently, providing both process simplification and cost reduction.

Referring now to FIG. 4, the flat-cell mask ROM of the present invention having halo ROM isolation is described. Buried bit lines lie 20 within a P-well 12 in a semiconductor substrate 10. P-type halo implanted regions 28 encompass each buried bit line, isolating it from adjacent bit lines. Polysilicon gate area 30 overlies gate oxide layer 16 on the surface of the substrate to complete the ROM device.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a flat-cell mask read-only memory (ROM) device comprising:

forming a P-well within a semiconductor substrate;

forming an oxide layer overlying a surface of said semiconductor substrate;

forming a photomask overlying said oxide layer wherein openings are left within said photomask exposing portions of said oxide layer;

first implanting ions through said exposed portions of said oxide layer not covered by said photomask into underlying said semiconductor substrate whereby buried bit lines are formed within said semiconductor substrate;

thereafter second implanting ions through said exposed portions of said oxide layer not covered by same said photomask whereby halo regions are formed encompassing said buried bit lines;

thereafter removing said photomask; and completing fabrication of said flat-cell mask ROM device.

2. The method according to claim 1 wherein said oxide layer has a thickness of between about 125 to 250 Angstroms.

3. The method according to claim 1 wherein said step of first implanting ions comprises implanting arsenic ions at a dosage of between about 1.5 E 13 and 3 E 15 atoms/cm$^2$ and an energy of between about 40 and 80 KeV.

4. The method according to claim 1 wherein said step of second implanting ions comprises implanting boron ions at a dosage of between about 1.2 E 13 and 1.5 E 13 atoms/cm$^2$ and an energy of between about 100 and 140 KeV.

5. The method according to claim 1 wherein said halo regions provide ROM isolation and punch-through protection for said ROM device.

6. A method of fabricating a flat-cell mask read-only memory (ROM) device comprising:

forming a P-well within a semiconductor substrate;

forming an oxide layer overlying a surface of said semiconductor substrate;

forming a photomask overlying said oxide layer wherein openings are left within said photomask exposing portions of said oxide layer;

first implanting ions through said exposed portions of said oxide layer not covered by said photomask into underlying said semiconductor substrate whereby buried bit lines are formed within said semiconductor substrate;

thereafter implanting boron ions through said exposed portions of said oxide layer not covered by same said photomask at a dosage of between 1.2 E 13 and 1.5 E 13 atoms/cm$^2$ and an energy of between 100 and 140 KeV whereby halo regions are formed encompassing said buried bit lines wherein said halo regions provide ROM isolation and punch-through protection for said buried bit lines;

thereafter removing said photomask;

removing said oxide layer;

thereafter forming a gate oxide layer over said surface of said semiconductor substrate;

depositing a polysilicon layer overlying said gate oxide layer; and patterning said polysilicon layer to form a polysilicon gate thereby completing fabrication of said flat-cell mask ROM device.

7. The method according to claim 6 wherein said oxide layer has a thickness of between about 125 and 250 Angstroms.

8. The method according to claim 6 wherein said step of first implanting ions comprises implanting arsenic ions at a dosage of between about 1.5 E 13 and 3 E 13 atoms/cm$^2$ and an energy of between about 40 and 80 KeV.

* * * * *